(12) United States Patent
Oosumi

(10) Patent No.: US 7,652,380 B2
(45) Date of Patent: Jan. 26, 2010

(54) SEMICONDUCTOR DEVICE AND METHOD OF PRODUCING THE SAME

(75) Inventor: Takashi Oosumi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 194 days.

(21) Appl. No.: 11/638,550

(22) Filed: Dec. 14, 2006

(65) Prior Publication Data

US 2007/0262461 A1 Nov. 15, 2007

(30) Foreign Application Priority Data

May 9, 2006 (JP) .............................. 2006-130733

(51) Int. Cl.
*H01L 23/48* (2006.01)
(52) U.S. Cl. ...................................................... 257/773
(58) Field of Classification Search ................. 257/786, 257/737, 784, 735, 673, E23.015, E23.026, 257/773
See application file for complete search history.

(56) References Cited

U.S. PATENT DOCUMENTS

| | | | | |
|---|---|---|---|---|
| 5,808,365 | A * | 9/1998 | Mori | 257/775 |
| 6,201,305 | B1 * | 3/2001 | Darveaux et al. | 257/779 |
| 6,476,503 | B1 * | 11/2002 | Imamura et al. | 257/780 |
| 2004/0089944 | A1 * | 5/2004 | Watanabe | 257/734 |
| 2004/0201097 | A1 * | 10/2004 | Ohsumi | 257/737 |
| 2006/0019480 | A1 * | 1/2006 | Cheng et al. | 438/612 |

FOREIGN PATENT DOCUMENTS

JP 2000-183090 6/2000

* cited by examiner

*Primary Examiner*—Thao P. Le
(74) *Attorney, Agent, or Firm*—Kubotera & Associates, LLC

(57) ABSTRACT

A semiconductor device includes a substrate; a wiring formed on the substrate; a base portion disposed at an end portion of the wiring; and an electrode formed on the base portion. The base portion has a size smaller than that of the electrode, so that the base portion is not shifted out of the electrode.

8 Claims, 4 Drawing Sheets

US 7,652,380 B2

SEMICONDUCTOR DEVICE AND METHOD OF PRODUCING THE SAME

BACKGROUND OF THE INVENTION AND RELATED ART STATEMENT

The present invention relates to a semiconductor device having a packaged structure, and a method of producing the semiconductor device. In particular, the present invention relates to a semiconductor device called a wafer level Chip Size Package (CSP).

Patent Reference has disclosed technology for producing a semiconductor device of this type. FIGS. 4(a) and 4(b) are schematic views showing a post electrode of a conventional semiconductor device, in which FIG. 4(a) is a side view thereof, and FIG. 4(b) is a plan view thereof.

As shown in FIG. 4(a), an organic insulation layer 1 is formed on a passivasion layer of a wafer having an integrated circuit (not shown) formed thereon. A seed layer 2 is formed over a whole surface of the wafer with sputtering, so that plating current flows in a pattern formed with photolithography when a wiring or a post electrode is plated.

A wiring pattern is formed using resist with photolithography, and the wiring pattern is plated using the plating current supplied through the seed layer 2 to form a wiring 3. The wiring 3 is provided for electrically connecting a pad of the integrated circuit and a post electrode 5 (described later). The wiring 3 includes a base portion 4a having an octagon shape at an end portion thereof.

The post electrode 5 having a column shape is formed on the base portion 4a. A post electrode pattern is formed on the base portion 4a using resist with photolithography, and the post electrode pattern is plated using the plating current supplied through the seed layer 2 to form the post electrode 5. The post electrode 5 is provided for electrically connecting a solder terminal or external terminal (not shown) and the wiring 3.

After the post electrode 5 is formed, the resist is removed, and the seed layer 2 exposed between the wiring 3 is etched, thereby electrically isolating the wiring 3.

A sealing resin 6 covers a surface where the wiring 3 and the post electrode 5 are formed. After molding, the sealing resin 6 is ground, so that a top of the post electrode 5 is exposed. The solder terminal (not shown) is formed on the top of the post electrode 5 thus exposed. After the solder terminal is formed, the wafer is ground until a desirable thickness thereof is obtained. Then, the wafer is cut to an individual package with a dicing process, thereby obtaining the semiconductor device.

In the conventional semiconductor device, the base portion 4a of the wiring 3 has a diameter greater than that of the post electrode 5 as shown in FIG. 4(b). A difference between the diameter of the base portion 4a and that of the post electrode 5 depends on an overlapping dimension of photolithography when the post electrode 5 is formed. That is, a size of the base portion 4a is set such that the post electrode 5 is situated on the base portion 4a without shifting out thereof in consideration of production accuracy when the post electrode 5 is formed with photolithography.

Patent Reference: Japanese Patent Publication No. 2000-183090

In the conventional semiconductor device described above, the base portion 4a has the diameter greater than that of the post electrode 5. Accordingly, it is difficult to arrange a large number of wirings between the post electrodes. Further, when the wiring is made smaller to accommodate an increased number of wirings, it is difficult to accurately produce the semiconductor. Further, a configuration surrounding the post electrode becomes more complicated, and a shape varies to larger extent.

Further, when the resist pattern is formed for forming the post electrode, it is necessary to match a mask during photolithography process. Accordingly, it is necessary to provide an area on the wafer for disposing a positioning mark for matching the mask. The positioning mark remains in a final structure of the semiconductor as a defect.

In view of the problems described above, an object of the present invention is to provide a semiconductor device to solve the problems of the conventional semiconductor device.

Further objects and advantages of the invention will be apparent from the following description of the invention.

SUMMARY OF THE INVENTION

In order to attain the objects described above, according one aspect of to the present invention, a semiconductor device includes a substrate; a wiring formed on the substrate; a base portion disposed at an end portion of the wiring; and an electrode formed on the base portion. The base portion has a size smaller than that of the electrode, so that the base portion is not shifted out of the electrode.

Accordingly, when a plurality of electrodes is arranged in a row, the base portion is not shifted from one of the electrodes toward another of the electrodes next to the one of the electrodes. As a result, it is possible to obtain a large area between the electrodes, and to accommodate a large number of wirings.

After the electrode is formed, the base portion is completely covered with the electrode. As a result, the electrode including the base portion has a simple shape, and a variance in the shape due to overlapping accuracy relative to the base portion becomes small.

BRIEF DESCRIPTION OF THE DRAWINGS

FIGS. 1(a) and 1(b) are schematic views showing a post electrode according to a first embodiment of the present invention, wherein FIG. 1(a) is a side view thereof, and FIG. 1(b) is a plan view thereof;

FIGS. 2(a) and 2(b) are schematic plan views showing a wiring space between electrodes, in which FIG. 2(a) is a view according to the first embodiment of the present invention, and FIG. 2(b) is a view according to a conventional semiconductor device;

FIGS. 3(a) and 3(b) are schematic views according to a second embodiment of the present invention, wherein FIG. 3(a) is a side view, and FIG. 3(b) is a plan view; and FIGS. 4(a) and 4(b) are schematic views showing a post electrode according to a conventional semiconductor device, wherein FIG. 4(a) is a side view thereof, and FIG. 4(b) is a plan view thereof.

DETAILED DESCRIPTION OF PREFERRED EMBODIMENTS

Hereunder, embodiments of the present invention will be explained with reference to the accompanying drawings.

First Embodiment

Figure 1A:
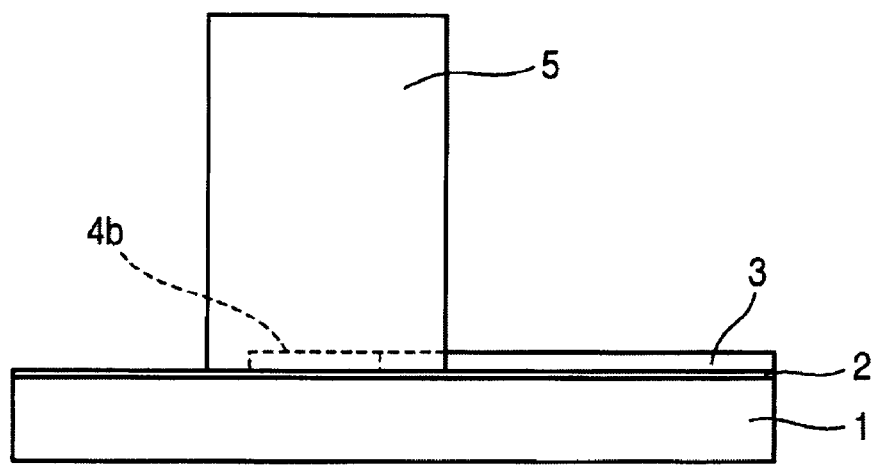
Figure 1B:
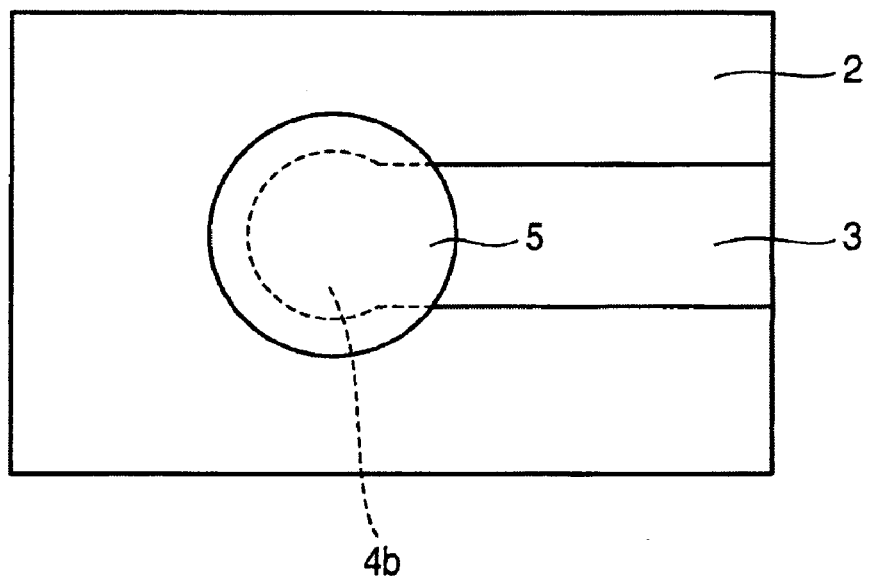

FIGS. 1(a) and 1(b) are schematic views showing a post electrode according to a first embodiment of the present invention, wherein FIG. 1(a) is a side view thereof, and FIG.

1(*b*) is a plan view thereof. A semiconductor device after the post electrode is formed and before a seed layer is etched is shown in FIGS. 1(*a*) and 1(*b*).

As shown in FIG. 1(*a*), an organic insulation layer 1 is formed on a passivasion layer of a wafer (substrate) having an integrated circuit (not shown) formed thereon. The organic insulation layer 1 may be formed of a material such as a polyimide resin, a BCB resin, and a PBO resin. A seed layer 2 is formed of metal such as tungsten, nickel, and chrome, so that plating current flows in a pattern formed with photolithography when a wiring or post electrode is plated.

A wiring 3 is provided for electrically connecting a pad of an integrated circuit (not shown) and a post electrode 5 (described later). The wiring 3 includes a base portion 4*b*, and is formed of copper due to low resistance. The wiring 3 may be formed of gold, silver, or aluminum. In the first embodiment of the present invention, the base portion 4*b* has a circular shape with a diameter smaller than that of the post electrode 5 (described later).

The post electrode 5 having a column shape is formed on the base portion 4*b*. The post electrode 5 is formed to penetrate through a sealing resin 6 in a final structure of the semiconductor device. The post electrode 5 is provided for electrically connecting a solder terminal or external terminal (not shown) and the wiring 3.

A method of producing the semiconductor device will be explained next.

First, a wafer having a semiconductor circuit formed thereon is prepared, and the passivasion layer is formed on a pad in an opened state. Then, the organic insulation layer 1 covers the passivasion layer, and an opening portion of the organic insulation layer 1 is formed such that the opening portion overlaps the opening of the passivasion layer on the pad.

In the next step, after the seed layer 2 is formed over a whole surface of the wafer with sputtering, a wiring pattern is formed using resist with photolithography. After the wiring pattern is plated using current supplied through the seed layer 2 to form the wiring 3 having the base portion 4*b* at an end portion thereof, the resist is removed.

Although the wiring 3 is singular in FIG. 1(*b*), a plurality of wirings 3 having the base portions 4*b* may be arranged in parallel, so that the base portions 4*b* are arranged in a row. Each of the wirings 3 has the other end portion opposite to the end portion having the base portion 4*b*, and the other end portion is connected to a pad of an integrated circuit (not shown) through the opening portion of the organic insulation layer 1.

In the next step, a post electrode pattern is formed on the base portion 4*b* using resist with photolithography. After the post electrode pattern is plated using the plating current supplied through the seed layer 2 to form the post electrode 5, the resist is removed. In the first embodiment of the present invention, the base portion 4*b* has a diameter smaller than that of the post electrode 5 (described later). Accordingly, the base portion 4*b* is embedded under the post electrode 5.

In the next step, the seed layer 2 exposed between the wiring 3 is etched, thereby electrically isolating the wiring 3. Then, the sealing resin 6 is molded to cover a surface where the wiring 3 and the post electrode 5 are formed. After the resin molding, the sealing resin 6 is ground, so that a top of the post electrode 5 is exposed.

In the next step, the solder terminal (not shown) is formed on the top of the post electrode 5 thus exposed. After the solder terminal is formed, the wafer is ground until a desirable thickness thereof is obtained. Then, the wafer is cut to an individual package with a dicing process, thereby obtaining the semiconductor device.

In the semiconductor device thus produced, the post electrode 5 penetrates through the sealing resin 6, so that the solder terminal or external terminal is electrically connected to the wiring 3. As described above, the wiring 3 has the other end portion opposite to the end portion having the base portion 4*b*, and the other end portion is connected to the pad of the integrated circuit (not shown) through the opening portion of the organic insulation layer 1. Accordingly, the pad of the integrated circuit is electrically connected to the solder terminal or external terminal.

In the first embodiment of the present invention, the base portion 4*b* has a diameter smaller than that of the post electrode 5. Accordingly, the base portion 4*b* is embedded and hidden under the post electrode 5. A difference between the diameter of the base portion 4*b* and that of the post electrode 5 is designed to be larger than mask overlapping accuracy when the post electrode 5 is formed with photolithography. That is, a size of the base portion 4*a* is set to be smaller than an overlapping dimension necessary for forming the post electrode 5 with photolithography. Accordingly, when the post electrode 5 is formed with plating, the base portion 4*b* is embedded under the post electrode 5, and is not exposed from a circumference of the post electrode 5.

In the first embodiment of the present invention, the post electrode 5 may have a diameter equal to about a half of a pitch of the external solder terminal. For example, when the pitch of the external solder terminal is 0.50 mm, the post electrode 5 may have a diameter of 0.25 mm.

As described above, in the first embodiment of the present invention, the following effect can be obtained.

Figure 2A:
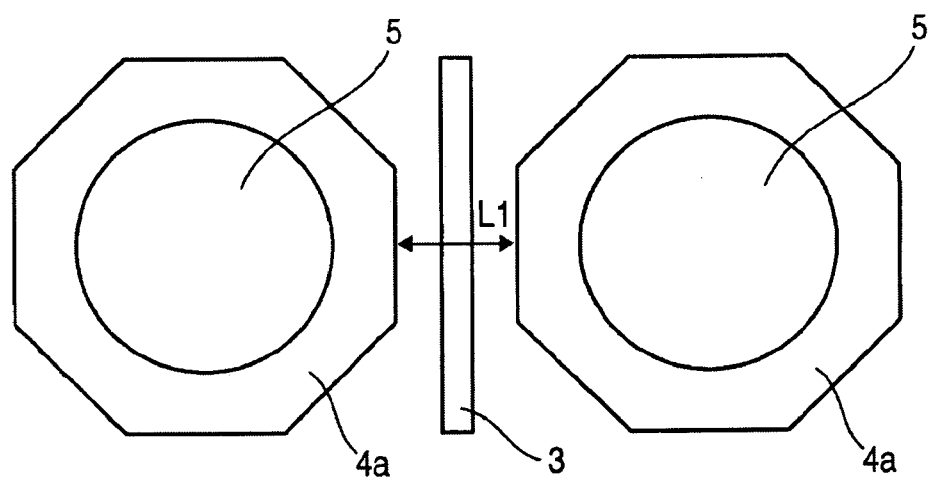
Figure 2B:
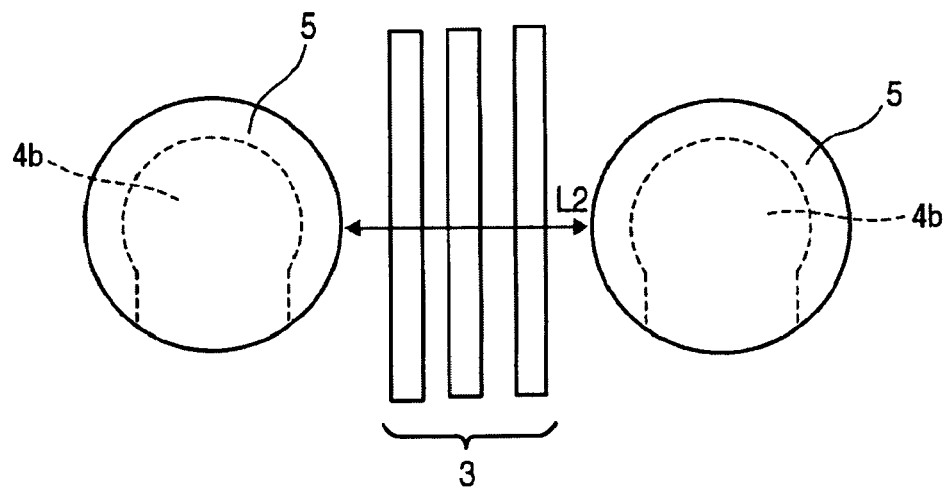

FIGS. 2(*a*) and 2(*b*) are schematic plan views showing a wiring space between the post electrodes, in which FIG. 2(*a*) is a view according to the first embodiment of the present invention, and FIG. 2(*b*) is a view according to a conventional semiconductor device.

As shown in FIG. 2(*b*), in the conventional semiconductor device, the wiring space is equal to a distance L1 between the base portions 4*a*. On the other hand, in the first embodiment of the present invention, the base portions 4*b* are embedded under the post electrodes 5, and are not exposed from the post electrodes 5 between the post electrodes 5 arranged adjacent to each other. Accordingly, as shown in FIG. 2(*a*), the wiring space is equal to a distance L2 between the post electrodes 5, which is larger than that in the conventional semiconductor device. As a result, it is possible to accommodate a larger number of the wirings 3 between the post electrodes 5.

Further, after the post electrodes 5 are formed, the base portions 4*b* are completely covered with the post electrodes 5. As a result, the post electrodes 5 including the base portions 4*b* have a simple shape. As compared with the conventional semiconductor device, a variance in the shape due to overlapping accuracy relative to the base portions 4*b* becomes small, thereby making it possible to obtain the post electrodes 5 with uniform quality.

Second Embodiment

A second embodiment of the present invention will be explained next. FIGS. 3(*a*) and 3(*b*) are schematic views according to a second embodiment of the present invention, wherein FIG. 3(*a*) is a side view, and FIG. 3(*b*) is a plan view. Components in the second embodiment same as those in the first embodiment are designated by the same reference numerals.

Figure 3A:
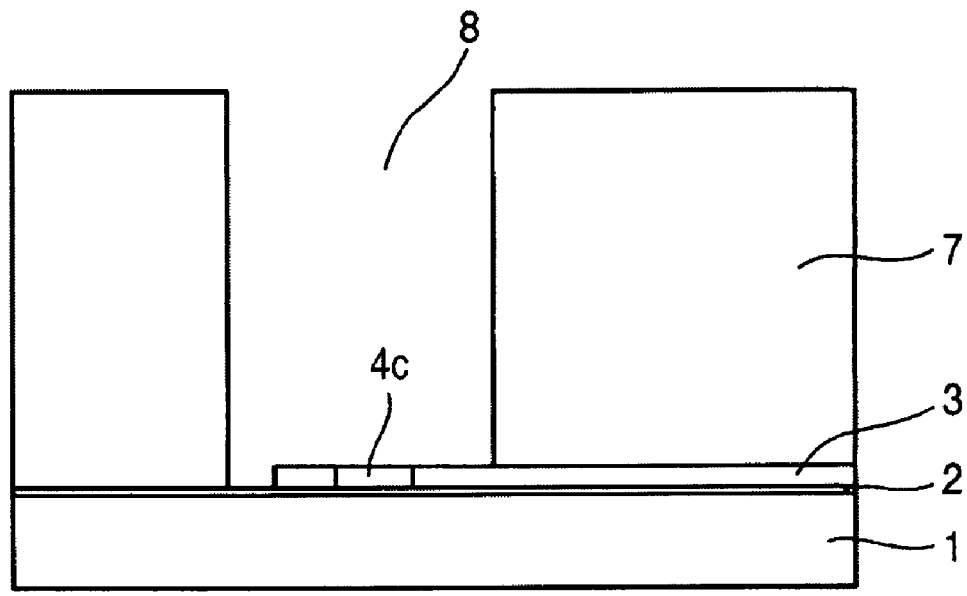

As shown in FIG. 3(a), the organic insulation layer 1 is formed on a passivasion layer of an integrated circuit on a wafer. The seed layer 2 is formed on the organic insulation layer 1. The wiring 3 is formed on the seed layer 2, and a base portion 4c is disposed in the wiring 3.

Figure 3B:
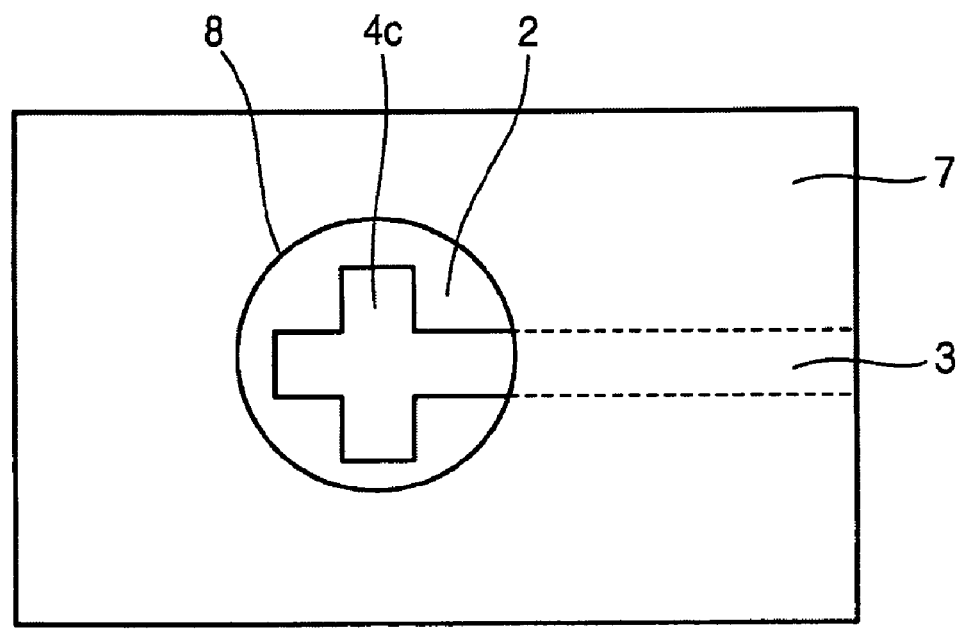
Figure 4A:
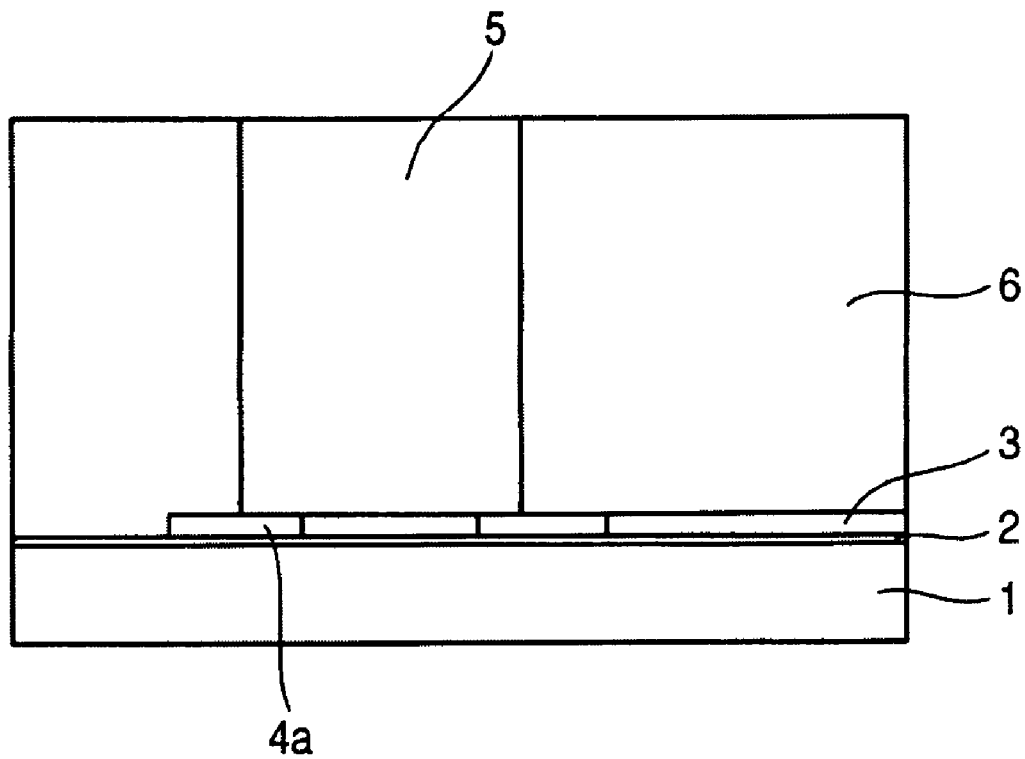
Figure 4B:
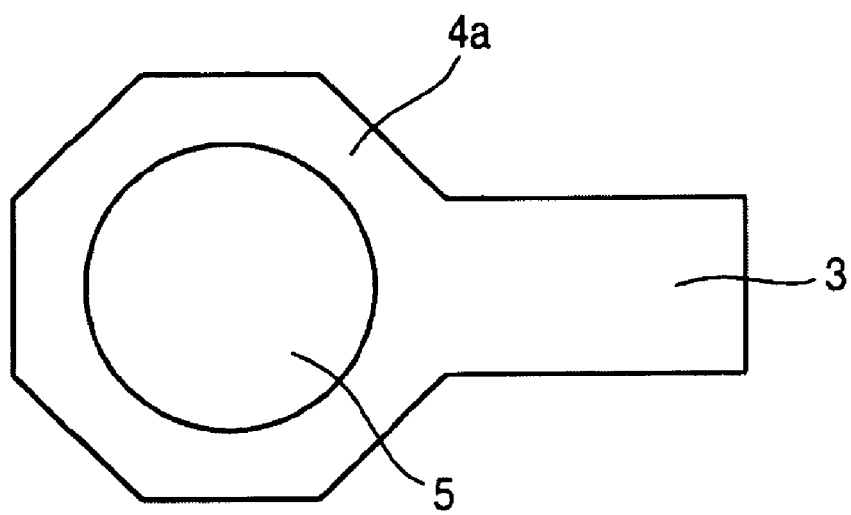

In the second embodiment of the present invention, the base portion 4c functions as a positioning mark for mask matching when the post electrode 5 is formed with photolithography. To this end, as shown in FIG. 3(b), the base portion 4c has a cross shape, which is different from the shape of the base portion 4b shown in FIG. 1(b).

A resist 7 is coated on the wafer for conducting photolithography. The base portion 4c having a cross shape functions as the positioning mark, and the mask matching is conducted on the resist 7 relative to the positioning mark as standard. After exposure, the resist 7 on the base portion 4c is removed, thereby forming a resist pattern 8.

The base portion 4c having a cross shape is situated in the resist pattern 8, and the resist pattern 8 is plated to form the past electrode 5 as shown in FIG. 1(a). Note that the base portion 4c having a cross shape is applied to a base portion of at least one post electrode 5 among a plurality of the post electrodes 5 arranged in a plurality of rows and columns.

As described above, in the second embodiment of the present invention, the base portion 4c of at least one post electrode 5 has a cross shape, which is different from the shape of the base portions 4b of other post electrodes 5. The base portion 4c functions as a positioning mark for positioning a mask when the post electrodes 5 are formed with photolithography. Accordingly, it is possible to securely identify the positioning mark for positioning the mask.

Further, the base portion 4c functioning as the positioning mark is embedded under the post electrode 5 formed of a material same as that of the base portion 4c. Accordingly, it is not necessary to provide an area for arranging the positioning mark, so that the positioning mark does not remain in a final structure as a defect.

An undulated pattern may be formed on the organic insulation layer 1 for embedding the positioning mark. However, when such an undulated pattern is formed on the organic insulation layer 1, the organic insulation layer 1 may have a different structure at the positioning mark, thereby causing a variance in the structure of the organic insulation layer 1. On the other hand, in the second embodiment of the present invention, it is possible to prevent such a variance in the structure of the organic insulation layer 1.

In the embodiments described above, the post electrode 5 has a circular shape, and the base portions 4b and 4c embedded under the post electrode 5 has a circular shape and a cross shape, respectively. These shapes are not limited to those in the embodiments. For example, the post electrode 5 may have an octagon column shape. The base portion 4b may have an octagon shape and the likes. The base portion 4b may have an arbitrary shape as far as the shape is distinguishable from other base portions.

The disclosure of Japanese Patent Application No. 2006-130733, filed on May 9, 2006, is incorporated in the application.

While the invention has been explained with reference to the specific embodiments of the invention, the explanation is illustrative and the invention is limited only by the appended claims.

What is claimed is:

1. A semiconductor device, comprising:
   a substrate;
   a seed layer formed on the substrate;
   a wiring formed on the seed layer;
   a base portion disposed at an end portion of the wiring; and
   an electrode formed on the base portion and having a size greater than that of the base portion so that the base portion is not shifted out of the electrode, said electrode having a cylindrical column shape extending from the base portion, said electrode being directly connected to the seed layer.

2. The semiconductor device according to claim 1, wherein said wiring includes a plurality of wiring sections, each of said wiring sections having the base portion and the electrode so that the base portion is not exposed from the electrode between the electrodes arranged adjacent to each other.

3. The semiconductor device according to claim 1, wherein said base portion has a diameter smaller than that of the electrode.

4. The semiconductor device according to claim 1, wherein said base portion has a diameter smaller than that of the electrode such that a difference between the diameter of the base portion and that of the electrode becomes greater than mask overlapping accuracy when the electrode is formed with photolithography.

5. The semiconductor device according to claim 1, wherein said base portion has a portion having a cross shape.

6. A method of producing a semiconductor device, comprising the steps of:
   forming a seed layer on a substrate;
   forming a plurality of wirings on the seed layer;
   forming a base portion at an end portion of each of the wirings such that at least one of the base portions has a shape different from that of the other of the base portions;
   conducting mask matching using the one of the base portions as a positioning mark; and
   forming an electrode on each of the base portions with photolithography so that the electrode has a size greater than that of each of the base portions so that each of the base portions is not shifted out of the electrode, and the electrode is directly connected to the seed layer.

7. The method of producing a semiconductor device according to claim 6, wherein, in the step of forming the base portion at the end portion of each of the wirings, said at least one of the base portions is formed to have a cross shape.

8. The method of producing a semiconductor device according to claim 6, wherein, in the step of forming the electrode, said electrode has a cylindrical column shape extending from each of the base portions.

* * * * *